United States Patent
Ikeda et al.

(10) Patent No.: US 11,543,447 B2
(45) Date of Patent: Jan. 3, 2023

(54) DAMAGE PREDICTING DEVICE AND DAMAGE PREDICTING METHOD FOR POWER SEMICONDUCTOR SWITCHING ELEMENT, AC-DC CONVERTER, AND DC-DC CONVERTER

(71) Applicant: Nidec Corporation, Kyoto (JP)

(72) Inventors: Hidetoshi Ikeda, Kyoto (JP); Takashi Togawa, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 641 days.

(21) Appl. No.: 16/490,624

(22) PCT Filed: Feb. 16, 2018

(86) PCT No.: PCT/JP2018/005532
§ 371 (c)(1),
(2) Date: Sep. 3, 2019

(87) PCT Pub. No.: WO2018/168328
PCT Pub. Date: Sep. 20, 2018

(65) Prior Publication Data
US 2020/0014295 A1    Jan. 9, 2020

(30) Foreign Application Priority Data
Mar. 14, 2017    (JP) .............................. JP2017-049158

(51) Int. Cl.
*G01R 31/26* (2020.01)
*H02M 1/32* (2007.01)
(Continued)

(52) U.S. Cl.
CPC ......... *G01R 31/2621* (2013.01); *G01R 31/26* (2013.01); *H02M 1/32* (2013.01);
(Continued)

(58) Field of Classification Search
None
See application file for complete search history.

(56) References Cited

U.S. PATENT DOCUMENTS 5,909,108 A * 6/1999 He ...................... H02M 3/1584
                                                        323/225
6,434,029 B1 * 8/2002 Cyr ...................... H02M 3/158
                                                        323/222
(Continued)

FOREIGN PATENT DOCUMENTS

JP    2000-023452 A    1/2000
JP    2000-308250 A    11/2000
(Continued)

OTHER PUBLICATIONS

Official Communication issued in International Patent Application No. PCT/JP2018/005532, dated May 15, 2018.

*Primary Examiner* — Jeffery S Zweizig
(74) *Attorney, Agent, or Firm* — Keating & Bennett

(57) ABSTRACT

A damage predicting device of a power semiconductor switching element includes a resistor connected to a gate of the power semiconductor switching element, and control circuitry. The control circuitry compares a detection voltage matching a voltage generated between two ends of the resistor and a reference voltage, and predicts that predetermined damage has been accumulated in a gate insulating layer in the power semiconductor switching element when the detection voltage exceeds the reference voltage.

10 Claims, 17 Drawing Sheets

(51) Int. Cl.
*H02M 3/155* (2006.01)
*H02M 7/12* (2006.01)
*H03K 17/16* (2006.01)
*H02M 1/42* (2007.01)

(52) U.S. Cl.
CPC ......... *H02M 1/4225* (2013.01); *H02M 3/155* (2013.01); *H02M 7/12* (2013.01); *H03K 17/168* (2013.01)

(56) References Cited

U.S. PATENT DOCUMENTS

| | | | | |
|---|---|---|---|---|
| 7,205,843 B2* | 4/2007 | Nagata | ...................... | H03F 1/52 330/298 |
| 7,898,235 B2* | 3/2011 | Seo | ....................... | H02M 3/156 323/284 |
| 8,373,397 B2* | 2/2013 | Tanifuji | ................. | H02M 3/158 323/284 |
| 8,384,368 B2* | 2/2013 | Osaka | ................... | H02M 3/156 323/224 |
| 8,649,190 B2* | 2/2014 | Chen | ................ | H02M 3/33592 363/21.06 |
| 8,941,323 B1* | 1/2015 | Wu | ...................... | H05B 45/395 315/192 |
| 9,800,239 B2* | 10/2017 | Hayashiguchi | .. | H03K 17/08122 |
| 2007/0139841 A1 | 6/2007 | Ohshima | | |
| 2008/0122497 A1 | 5/2008 | Ishikawa et al. | | |

FOREIGN PATENT DOCUMENTS

| | | |
|---|---|---|
| JP | 2003-143833 A | 5/2003 |
| JP | 2005-217774 A | 8/2005 |
| JP | 2007-202238 A | 8/2007 |
| JP | 2008-042317 A | 2/2008 |

\* cited by examiner

DAMAGE PREDICTING DEVICE AND DAMAGE PREDICTING METHOD FOR POWER SEMICONDUCTOR SWITCHING ELEMENT, AC-DC CONVERTER, AND DC-DC CONVERTER

CROSS REFERENCE TO RELATED APPLICATION

This a U.S. national stage of PCT Application No. PCT/JP2018/005532, filed on Feb. 16, 2018, and priority under 35 U.S.C. § 119(a) and 35 U.S.C. § 365(b) is claimed from Japanese Application No. 2017-049158, filed Mar. 14, 2017; the entire disclosures of each application are incorporated herein by reference.

FIELD OF THE INVENTION

The present disclosure relates to a damage predicting device and damage predicting method of a power semiconductor switching element, as well as an AC-DC converter and a DC-DC converter.

BACKGROUND

Electric power conversion devices, such as an AC-DC converter that, when an alternating-current voltage is converted to a direct-current voltage, outputs a direct-current voltage with a predetermined value by periodically turning on/off a power semiconductor switching element and a DC-DC converter that, when a direct-current voltage is converted to another direct-current voltage having a different value from the direct-current voltage, outputs a direct-current voltage with a predetermined value by periodically turning on/off a power semiconductor switching element, are known.

For the electric power conversion devices described above, there is a case in which, for example, a power semiconductor switching element, such as a FET (Field Effect Transistor) formed from GaN (Gallium Nitride) (referred to below as the GaN-FET), a FET formed from SiC (Silicon Carbide) (referred to below as the SiC-FET), and an IGBT (Insulated Gate Bipolar Transistor), are used.

If these power semiconductor switching elements are used for the electric power conversion devices described above, however, there is the risk that the following problem occurs due to a large current driving capacity (di/dt) of the power semiconductor switching element. For example, when a power semiconductor switching element is periodically turned on/off, if a gate voltage to be applied to the gate of the power semiconductor switching element is changed from one of a high level and a low level to the other level, ringing having a frequency higher than the frequency of the gate voltage is superimposed on the gate voltage along with the resonance of an inductance component, a capacitance component, and the like parasitic to a circuit wire in an AC-DC converter or a DC-DC converter. That is, an overshoot or an undershoot appears for the gate voltage. If the gate voltage exceeds a rated voltage in this way, damage is gradually accumulated in a gate insulating layer in the power semiconductor switching element, and this may lead to the destruction of the power semiconductor switching element before long.

In the case of Japanese Patent No. 5186095, for example, the gate voltage of the power semiconductor switching element is detected. However, this is to reduce a switching loss and noise in the power semiconductor switching element and is not predictive of the extent of damage accumulated in the gate insulating layer in the power semiconductor switching element.

SUMMARY

Example embodiments of the present disclosure provide damage predicting devices that each enable prediction of an extent of damage accumulated in a gate insulating layer in a power semiconductor switching element, a damage predicting method, an AC-DC converter, and a DC-DC converter.

An example embodiment of the present disclosure provide damage predicting device of a power semiconductor switching element including a resistor connected to a gate of the power semiconductor switching element and control circuitry. The control circuitry compares a detection voltage matching a voltage generated between two ends of the resistor and a reference voltage when a predetermined voltage is applied to the gate of the power semiconductor switching element, and predicts that predetermined damage has been accumulated in a gate insulating layer in the power semiconductor switching element when the detection voltage exceeds the reference voltage.

Other features of the present disclosure will be clarified from the attached drawings and descriptions of example embodiments in this specification.

The above and other elements, features, steps, characteristics and advantages of the present disclosure will become more apparent from the following detailed description of the example embodiments with reference to the attached drawings.

DETAILED DESCRIPTION

At least the following points will be clarified from descriptions in this specification and the attached drawings.

Figure 1:
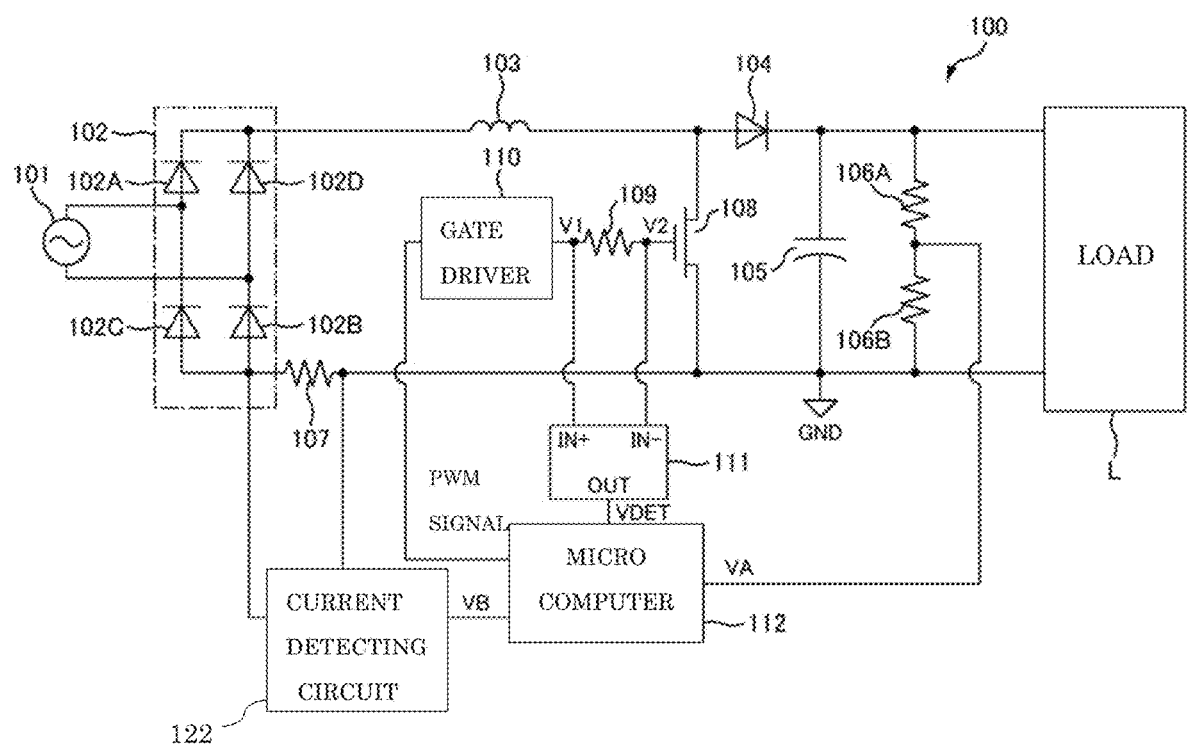
FIG. 1 is a circuit block diagram indicating an example of a step-up AC-DC converter having a damage predicting device according to a first example embodiment of the present disclosure.
Figure 2:
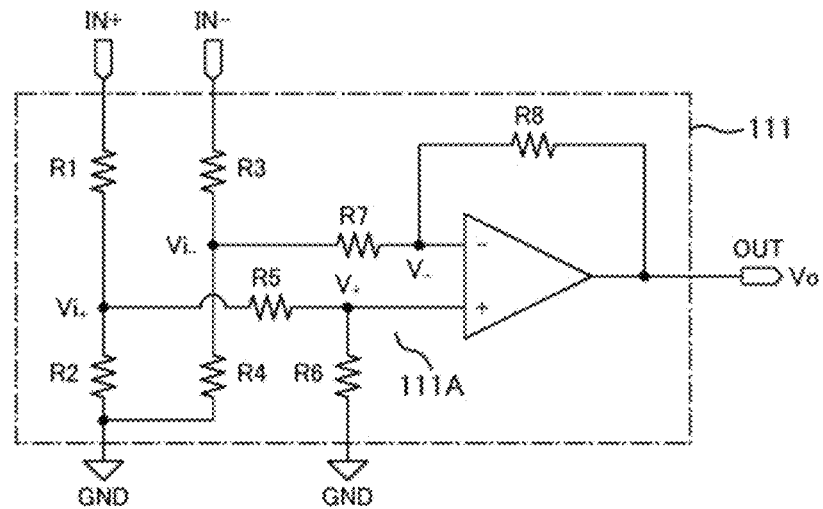
FIG. 2 is a circuit diagram indicating an example of a potential difference detecting circuitry used in the damage predicting device according to the first example embodiment of the present disclosure.
Figure 3:
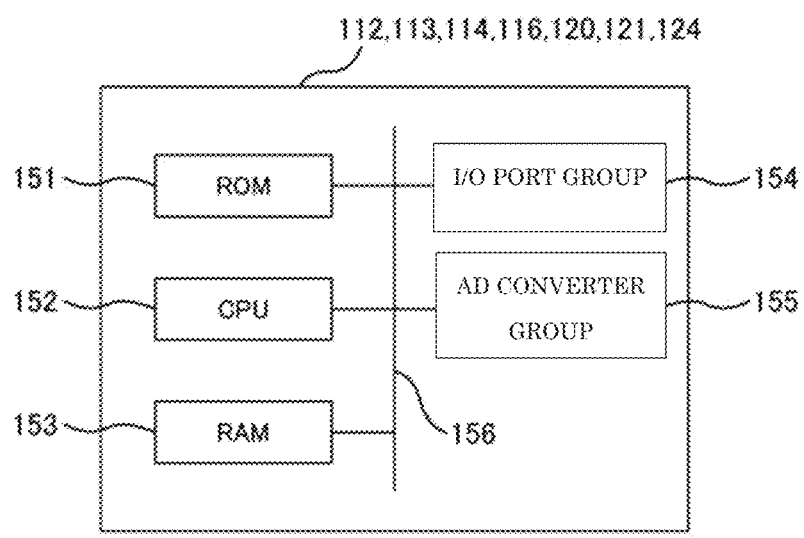
FIG. 3 is a block diagram indicating an example of hardware in a microcomputer used in the damage predicting device according to the first example embodiment of the present disclosure.
Figure 4:
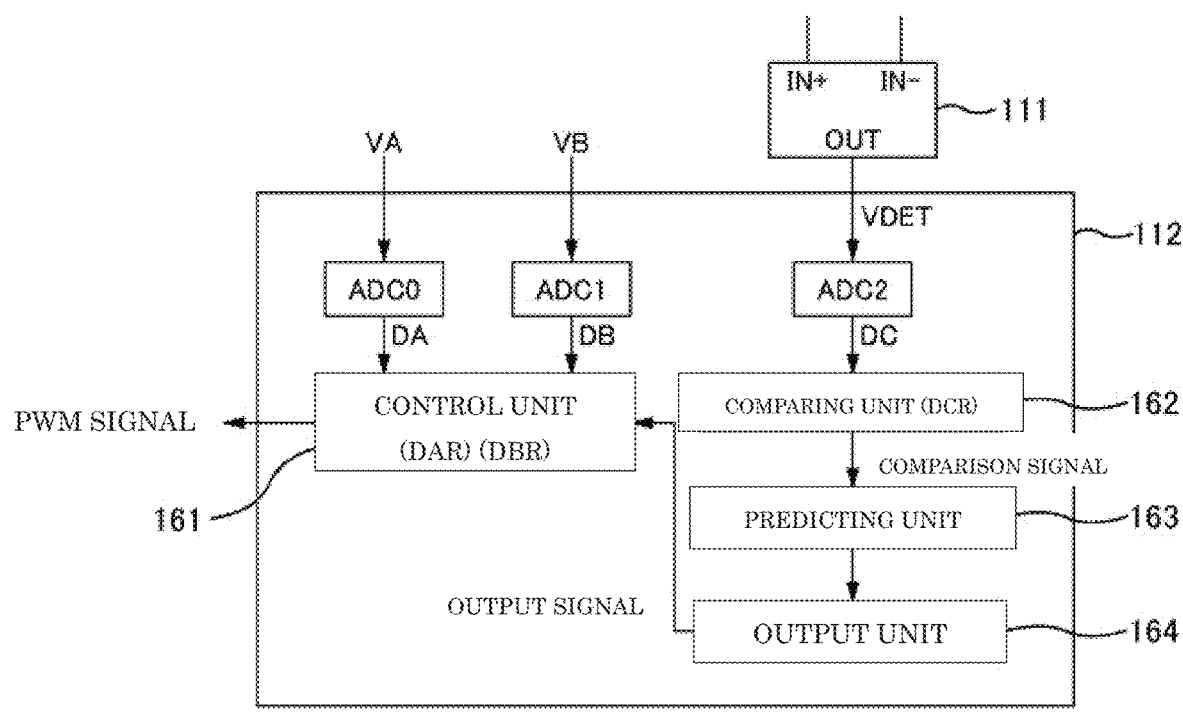
FIG. 4 is a block diagram indicating an example of functions implemented by the microcomputer used in the damage predicting device according to the first example embodiment of the present disclosure.

FIG. 1 is a circuit block diagram indicating an example of a step-up AC-DC converter having a damage predicting device according to this example embodiment. FIG. 2 is a circuit diagram indicating an example of a potential difference detecting circuitry used in the damage predicting device according to this example embodiment. FIG. 3 is a block diagram indicating an example of hardware in a microcomputer used in the damage predicting device according to this example embodiment. FIG. 4 is a block diagram indicating an example of functions implemented by the microcomputer used in the damage predicting device according to this example embodiment.

The structure of the AC-DC converter having the damage predicting device according to this example embodiment will be descried below while FIG. 1 to FIG. 4 are being referenced.

The AC-DC converter 100 is an electric power conversion device that, when an alternating-current voltage is converted to a direct-current voltage, outputs a direct-current voltage with a predetermined value by turning on/off a power semiconductor switching element, which will be described later, at a frequency higher than the frequency of the alternating-current voltage. Incidentally, the AC-DC converter 100 has a power factor improving circuit.

The AC-DC converter 100 having a power factor improving circuit is structured by including an alternating-current power supply 101 (for example, a commercial power supply that generates an alternating-current voltage at 50 Hz or 60 Hz), a full-wave rectifying circuit 102, a choke coil 103, a diode 104, a smoothing capacitor 105, voltage detecting resistors 106A and 106B, a current detecting resistor 107, a power semiconductor switching element 108, a gate resistor 109 (resistor), a gate driver 110, a potential difference detecting circuit 111 (potential difference detecting circuitry), and a microcomputer 112. Incidentally, the damage predicting device is structured by including the gate resistor 109, gate driver 110, potential difference detecting circuit 111, and microcomputer 112.

The full-wave rectifying circuit 102, which is a bridge circuit composed of four diodes 102A to 102D, outputs a direct-current voltage in which an alternating-current voltage generated from the alternating-current power supply 101 has been subject to full-wave rectification.

The choke coil 103 is provided to supply a direct-current voltage higher than the direct-current voltage after full-wave rectification to the smoothing capacitor 105. One end of the choke coil 103 is connected to one output end of the full-wave rectifying circuit 102. A direct current output from the full-wave rectifying circuit 102 is supplied to the choke coil 103. Incidentally, the choke coil 103 also plays the role of preventing the effect of a ripple current on the smoothing capacitor 105 and further plays the role of changing an alternating current input from the alternating-current power supply 101 to a sine wave.

The diode 104 and smoothing capacitor 105 are connected in series between the other end of the choke coil 103 and the ground GND.

The voltage detecting resistors 106A and 106B are provided to detect the output voltage of the AC-DC converter 100. The voltage detecting resistors 106A and 106B are connected in series between the anode of the diode 104 and the ground GND. That is, the serial body of the voltage detecting resistors 106A and 106B is connected in parallel to both ends of the smoothing capacitor 105 and a load L.

The current detecting resistor 107 is provided to detect a current flowing into the power semiconductor switching element 108 as a voltage. The current detecting resistor 107 is connected between the other output end of the full-wave rectifying circuit 102 and the ground point of the smoothing capacitor 105. Incidentally, a voltage generated between both ends of the current detecting resistor 107 is very low.

A current detecting circuit 122 is a circuit that amplifies the very low voltage generated between both ends of the current detecting resistor 107 according to a predetermined voltage amplification degree. The current detecting circuit 122 can be implemented by using, for example, a known inverting amplification circuit or differential amplification circuit. Due to this, in an ADC 1 described later, it becomes possible to reliably obtain digital data DB equivalent to the very low voltage generated between both ends of the current detecting resistor 107.

The power semiconductor switching element 108 is provided to supply a direct-current voltage higher than the direct-current voltage after full-wave rectification to the smoothing capacitor 105 in cooperation with the choke coil 103. In the case of this example embodiment, the power semiconductor switching element 108 has properties such as high voltage resistance, low loss, high efficiency, and high frequency. For example, the power semiconductor switching element 108 is a GaN-HEMT (High Electron Mobility Transistor), which is one type of GaN (Gallium Nitride)-FET (Field Effect Transistor). A GaN-HEMT is an element that uses, as a path for a current, a two-dimensional electron gas present on the interface of a two-layer hetero-structure composed of GaN and AlGan (Gallium Aluminum Nitride) to increase the mobility of electrons. For convenience of explanation, the power semiconductor switching element 108 will sometimes be referred to below as the GaN-HEMT 108.

In principle, a GaN-HEMT is an element that operates as a normally-on element. However, the GaN-HEMT used in this example embodiment is an element that has been improved so as to operate as a normally-off element. As technologies to improve a GaN-HEMT so as to operate as a normally-off element, a technology that changes the gate structure of the GaN-HEMT so as to have an enhance property and a technology to connect a MOSFET having a low voltage-resistance to the source of the GaN-HEMT in a cascade connection are known. The GaN-HEMT used in this example embodiment may have been implemented by any technology. Incidentally, for convenience of explanation, the GaN-HEMT 108 in the drawings is represented as a symbol for one FET.

The drain of the GaN-HEMT 108 is connected to the other end of the choke coil 103. The source of the GaN-HEMT 108 is connected to the ground GND. Also, the gate of the GaN-HEMT 108 is connected to the gate driver 110 through the gate resistor 109.

The gate driver 110 outputs a two-valued switching signal, which becomes at a high level (for example, 5 volts) when the GaN-HEMT 108 is to be turned on and becomes at a low level (for example, 0 volt) when the GaN-HEMT 108 is to be turned off, in response to a command from the microcomputer 112. That is, the GaN-HEMT 108 is turned on/off according to a change in the level of the switching signal.

Here, when the GaN-HEMT 108 is provided in the AC-DC converter 100, there is the risk that the following problem occurs due to a large current driving capacity (di/dt) of the GaN-HEMT 108. For example, when the switching signal output from the gate driver 110 changes to a high level or low level, a resonance occurs. This resonance is caused by the inductance component of a circuit wire in the AC-DC converter 100 or the choke coil 103 in it and the capacitance component of a circuit wire in the AC-DC converter 100 or the smoothing capacitor 105 in it. When this resonance occurs, ringing having a frequency higher than the frequency of the gate voltage (frequency of the switching signal) is superimposed on the gate voltage to be applied to the gate of the GaN-HEMT 108. That is, when the switching signal changes to a high level, an overshoot appears in the gate voltage. On the other hand, when the switching signal changes to a low level, an undershoot appear in the gate voltage. Each time the gate voltage exceeds the rated voltage of the gate of the GaN-HEMT 108, damage is gradually accumulated in a gate insulating layer in the GaN-HEMT 108 and this may lead to the destruction of the GaN-HEMT 108 before long. Therefore, it is necessary to predict the extent of damage accumulated in the gate insulating layer in the GaN-HEMT 108 and to prevent the AC-DC converter 100 from being troubled due to the destruction of the GaN-HEMT 108.

When damage is accumulated in the gate insulating layer in the GaN-HEMT 108, a resistance value between the gate and source of the GaN-HEMT 108 is reduced. Here, the gate voltage (high level) when the GaN-HEMT 108 is to be turned on is a fixed value. When damage is accumulated in the gate insulating layer in the GaN-HEMT 108, therefore, a current flowing between the gate and source of the GaN-HEMT 108 is increased when the GaN-HEMT 108 is turned on. Therefore, a current by which the current flowing between the gate and source of the GaN-HEMT 108 has been increased flows into the gate resistor 109 as a leak current. In this example embodiment, therefore, noting the leak current flowing into the gate resistor 109 when the GaN-HEMT 108 is turned on, a damage predicting device is provided that predicts the extent of the damage of the gate insulating layer in the GaN-HEMT 108.

The potential difference detecting circuit 111 indicated in FIG. 2 is a circuit that outputs a detection voltage VDET matching the leak current flowing into the gate resistor 109, that is, the detection voltage VDET matching a voltage generated between both ends of the gate resistor 109, by acquiring a potential difference V1−V2 between a potential V2 (second potential) generated at one end of the gate resistor 109 on the same side as the GaN-HEMT 108 and a potential V1 (first potential) generated on the other end of the gate resistor 109 on the same side as the gate driver 110. The potential difference detecting circuit 111 has a first input terminal IN+, to which the potential V1 is input, a second input terminal IN−, to which the potential V2 is input, and an output terminal OUT, from which the detection voltage VDET is output. The potential difference detecting circuit 111 is structured by, for example, connecting a differential amplification circuit 111A having a predetermined voltage amplification degree to the first input terminal IN+, second input terminal IN−, and output terminal OUT so that the detection voltage VDET matching a leak current having a very small value can be output.

The differential amplification circuit 111A is structured by including an operational amplifier OP, dividing resistors R1 to R4, input resistors R5 and R7, a ground resistor R6, and a feedback resistance R8.

The dividing resistors R1 and R2 are connected in series between the first input terminal IN+ and the ground GND, and a connection point between the dividing resistors R1 and R2 is connected to the first input terminal (+) of the operational amplifier OP through the input resistor R5. The dividing resistors R3 and R4 are connected in series between the second input terminal IN− and the ground GND, and a connection point between the dividing resistors R3 and R4 is connected to the second input terminal (−) of the operational amplifier OP through the input resistor R7. The feedback resistance R8 is connected between the second input terminal (−) and output terminal of the operational amplifier OP. The ground resistor R6 is connected between the first input terminal (+) of the operational amplifier OP and the ground GND. Since the differential amplification circuit 111A is connected as described above, a voltage $V_o$ output from the output terminal of the operational amplifier OP is represented by equations (3) to (5) below.

When a voltage at the connection point between the dividing resistors R1 and R2 is denoted by $Vi_+$, a voltage at the connection point between the dividing resistors R3 and R4 is denoted by $Vi_−$, a voltage applied to the first input terminal (+) of the operational amplifier OP (voltage at a connection point between the input resistors R5 and R6) is denoted by $V_+$, and a voltage applied to the second input terminal (−) of the operational amplifier OP (voltage at a connection point between the input resistor R7 and feedback resistance R8) is denoted by $V_−$, the voltage $V_+$ is represented as in equation (1) and the voltage $V_−$ is represented as in equation (2).

$$V_+ = \frac{R6}{R5 + R6} V_{i+} \qquad (1)$$

$$V_- = \frac{R8 V_{i-} + R7 V_0}{R7 + R8} \qquad (2)$$

Here, if $V_+$ is equal to $V_-$, the voltage $V_o$ is represented as in equation (3).

$$V_O = \frac{R6(R7 + R8)V_{i+} - R8(R5 + R6)V_{i-}}{R7(R5 + R6)} \qquad (3)$$

Furthermore, if R5 is equal to R7 and R6 is equal to R8, the voltage $V_o$ is represented as in equation (4).

$$V_0 = \frac{R8}{R7}(V_{i+} - V_{i-}) \qquad (4)$$

Furthermore, $Vi_+$ and $Vi_-$ are represented as in equation (5) and equation (6).

$$V_{i+} = \frac{R2}{R1 + R2} V1 \qquad (5)$$

$$V_{i-} = \frac{R4}{R3 + R4} V2 \qquad (6)$$

If R1 is equal to R3 and R2 is equal to R4, the voltage $V_o$ is represented as in equation (7).

$$V_0 = \frac{R8}{R7} \cdot \frac{R2}{R1 + R2}(V1 - V2) \qquad (7)$$

As is clear from equation (7), the voltage amplification degree of the differential amplification circuit 111A is determined by (R8/R7)·(R2/(R1+R2)). Therefore, when voltages matching the potentials V1 and V2 are applied to the first input terminal (+) and second input terminal (−) of the operational amplifier OP, a voltage amplified according to the above voltage amplification degree is output from the output terminal of the operational amplifier OP, indicating that the voltage is output from the output terminal OUT as the detection voltage VDET.

The microcomputer 112 indicated in FIG. 3 performs, for the gate driver 110, control to adjust a period during which the switching signal is at a high level and a period during which the switching signal is at a low level so that a detection voltage VA generated at a connection point between the voltage detecting resistors 106A and 106B becomes a fixed value. The microcomputer 112 outputs a PMW signal that serves as a moment when the gate driver 110 outputs a switching signal. Each cycle of the PWM signal is composed of an On period and an Off period. The On period of the PWM signal is equivalent to the high-level period of the switching signal, and the Off period of the PWM signal is equivalent to the low-level period of the switching signal. If the detection voltage VA is raised beyond a fixed value, for example, the microcomputer 112 adjusts the On period of the PWM signal so as to be shortened and also adjusts the Off period of the PWM signal so as to be elongated, so that the detection voltage VA becomes the fixed value. Conversely, if the detection voltage VA falls below the fixed value, the microcomputer 112 adjusts the On period of the PWM signal so as to be elongated and also adjusts the Off period of the PWM signal so as to be shortened, so that the detection voltage VA becomes the fixed value. Incidentally, the On period and Off period of the PWM signal that is output first from the microcomputer 112 may have a relationship of a duty cycle of, for example, less than 50%, in which case the On period is shorter than the Off period. Alternatively, the On period and Off period may have a relationship of a duty cycle of 50% or more, in which case the On period is longer than the Off period.

The microcomputer 112 performs control for a power factor improvement operation so that the alternating current of the alternating-current power supply 101 becomes a sine wave and a detection voltage VB output from the current detecting circuit 122 has a full-wave rectified waveform of a sine wave.

Furthermore, the microcomputer 112 compares the detection voltage VDET and a reference voltage VREF and if the detection voltage VDET exceeds the reference voltage VREF, performs control to predict that predetermined damage has been accumulated in the gate insulating layer in the GaN-HEMT 108.

The microcomputer 112 is structured by including a ROM 151, a CPU 152, a RAM 153, an I/O port group 154, an AD converter group 155, and a bus 156. The ROM 151 is structured by a non-volatile memory such as a mask ROM or flash ROM. Programs to perform the above control have been stored in the ROM 151 in advance. The RAM 153 is structured by a volatile memory that can write and read out data in a period during which electric power for the RAM 153 is supplied. Data obtained as the result of program execution by the CPU 152 is written to the RAM 153. On the other hand, data necessary for program execution by the CPU 152 is read out from the RAM 153. The I/O port group 154 performs input or output of data necessary for program execution by the CPU 152. The A/D converter group 155 acquires analog data necessary for program execution by the CPU 152 from the outside and converts the analog data to digital data. The CPU 152 performs necessary computation processing for data read out from the RAM 153, data input to the I/O port group 154, data output from the A/D converter group 155, and the like, according to the contents of a program read out from the ROM 151. Incidentally, the ROM 151, CPU 152, RAM 153, I/O port group 154, and A/D converter group 155 are connected through the bus 156.

The microcomputer 112 indicated in FIG. 4 is an example of control circuitry used in example embodiments of the present disclosure, and preferably includes an ADC 0 to an ADC 2, provided as the AD converter group 155, a control unit 161, a comparing unit 162, a predicting unit 163, and an output unit 164. Incidentally, the control unit 161, comparing unit 162, predicting unit 163, and output unit 164 are functions implemented when the CPU 152 reads out program from the ROM 151 and executes them. It is noted that any other desirable manner of control circuitry such as, for example, a computer executing specific software, a circuit including discrete electronic components, etc. may be used in place of the microcomputer 112 of the specifically explained example embodiments of the present disclosure.

The ADC 0 acquires the detection voltage VA generated at the connection point between the voltage detecting resistors 106A and 106B and converts the detection voltage VA to digital data DA. At the same time, the ADC 1 acquires the detection voltage VB output from the current detecting circuit 122 and converts the detection voltage VB to digital data DB. The ADC 2 acquires the detection voltage VDET matching a leak current flowing into the gate resistor 109 and converts the detection voltage VDET to digital data DC.

Reference digital data DAR is stored in the control unit 161 in advance, the reference digital data DAR being the same as a conversion result in the ADC 0 when the detection voltage VA is a fixed value. Then, the control unit 161 compares the digital data DA and reference digital data DAR. If the digital data DA is larger than the reference digital data DAR, for example, the control unit 161 adjusts the On period of the PWM signal so as to be shortened and also adjusts the Off period of the PWM signal so as to be elongated, so that the digital data DA approaches the reference digital data DAR, after which the control unit 161 outputs the adjusted PWM signal. Conversely, if the digital data DA is smaller than the reference digital data DAR, the control unit 161 adjusts the On period of the PWM signal so as to be elongated and also adjusts Off period of the PWM signal so as to be shortened, so that the digital data DA approaches the reference digital data DAR, after which the control unit 161 outputs the adjusted PWM signal.

On the other hand, in the control unit 161, reference digital data DBR indicating a full-wave rectified waveform of a sine wave having a predetermined amplitude and frequency is stored in a lookup table so that control for a power factor improvement operation by the AC-DC converter 100 can be performed. The control unit 161 acquires the digital data DB, reads out the reference digital data DBR, and performs control for a power factor improvement operation so that the alternating current of the alternating-current power supply 101 becomes a sine wave and the detection voltage VB output from the 122 has a full-wave rectified waveform of a sine wave.

The comparing unit 162 compares the detection voltage VDET matching a leak current flowing into the gate resistor 109 and the reference voltage VREF. Since the comparing unit 162 is, for example, a function implemented by software processing by the microcomputer 112, the comparing unit 162 compares the digital data DC indicating the detection voltage VDET and digital data DCR indicating the reference voltage VREF. Incidentally, the digital data DCR is stored in the comparing unit 162 in advance as a value indicating that predetermined damage has been accumulated in the gate insulating layer in the GaN-HEMT 108. If the digital data DC does not exceed the digital data DCR, the comparing unit 162 outputs a comparison signal at one level (for example, a low level). If the digital data DC exceeds the digital data DCR, the comparing unit 162 outputs a comparison signal at another level (for example, a high level).

The predicting unit 163 monitors the level of the comparison signal output from the comparing unit 162 to predict whether predetermined damage has been accumulated in the gate insulating layer in the GaN-HEMT 108. If the comparison signal changes from one of its levels to the other level, the predicting unit 163 predicts that the predetermined damage has been accumulated in the gate insulating layer in the GaN-HEMT 108.

To prevent the AC-DC converter 100 from being troubled due to the destruction of the GaN-HEMT 108, the output unit 164 outputs an output signal at one level (for example, a high level) according to a prediction result indicating that predetermined damage has been accumulated in the gate insulating layer in the GaN-HEMT 108.

In this example embodiment, when the output signal changes to one of its levels, the control unit 161 stops the output of the PWM signal. Thus, the switching operation (periodic On/Off operation) of the GaN-HEMT 108 stops, making it possible to prevent the AC-DC converter 100 from being troubled due to the destruction of the GaN-HEMT 108. Furthermore, programs in the ROM 151 may be modified so that when the output signal changes to one of its levels, the control unit 161 alerts the manager of the AC-DC converter 100 with a prediction result indicating that predetermined damage has been accumulated in the GaN-HEMT 108 through a surveillance monitor (not illustrated) or a speaker (not illustrated).

First, when an alternating-current voltage is generated from the alternating-current power supply 101, a direct-current voltage in which an alternating-current voltage has been subject to full-wave rectification is output from the full-wave rectifying circuit 102. On the other hand, when a PWM signal is output from the microcomputer 112, a switching signal is output from the gate driver 110 and the GaN-HEMT 108 performs an On/Off operation. When the GaN-HEMT 108 is turned on, for example, a direct current supplied to the choke coil 103 flows into the ground GND through the GaN-HEMT 108, so the choke coil 103 is excited and excitation energy is accumulated in the choke coil 103. Also, when the GaN-HEMT 108 is turned off, the excitation energy in the choke coil 103 is released to the smoothing capacitor 105 through the diode 104. Incidentally, when the GaN-HEMT 108 performs an on/off operation, the On period and Off period of the PWM signal are adjusted so that the detection voltage VA approaches a fixed value. When the On/Off operation of the GaN-HEMT 108 is repeated like this, a direct-current voltage (direct-current voltage obtained by raising the direct-current voltage after full-wave rectification) that is higher than the direct-current voltage after full-wave rectification is supplied to the smoothing capacitor 105.

Figure 5:
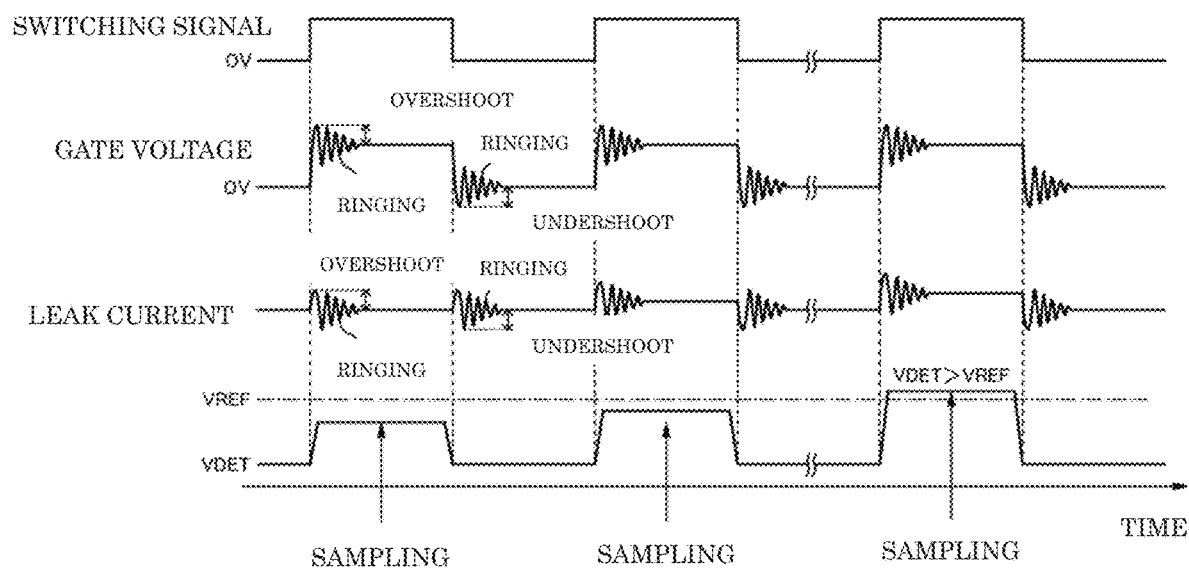
FIG. 5 is a waveform diagram that explains the operation of the damage predicting device according to the first example embodiment of the present disclosure.
Figure 6:
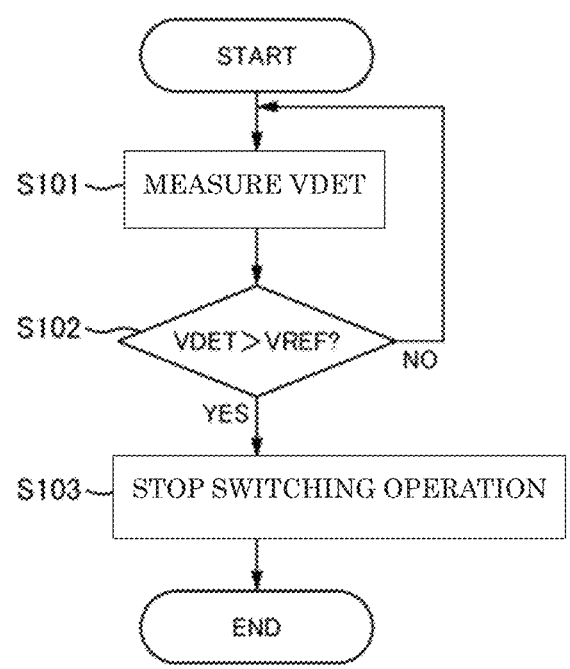
FIG. 6 is a flowchart that explains the operation of the damage predicting device according to the first example embodiment of the present disclosure.

FIG. 5 is a waveform diagram used to explain the operation of the damage predicting device according to this example embodiment. Incidentally, FIG. 5 schematically indicates states of waveforms until the detection voltage VDET exceeds the reference voltage VREF in a process in which damage is accumulated in the gate insulating layer in the GaN-HEMT 108. FIG. 6 is a flowchart used to explain the operation of the damage predicting device according to this example embodiment. Incidentally, the main body that executes the operation in FIG. 6 is the microcomputer 112.

The operation of the damage predicting device will be described below while FIG. 5 and FIG. 6 are being referenced.

When a switching signal output from the gate driver 110 is applied to the gate of the GaN-HEMT 108, a gate voltage that is synchronous with the switching signal and changes in phase with the switching signal is generated at the gate of the GaN-HEMT 108. Incidentally, since the current driving capacity of the GaN-HEMT 108 is large, when the switching signal changes to a high level, ringing is superimposed on the gate voltage and an overshoot appears. When the switching signal changes to a low level, ringing is superimposed on the gate voltage and an undershoot appears. Then, each time the gate voltage exceeds the rated voltage of the gate of the GaN-HEMT 108 due to the overshoot or undershoot, damage is gradually accumulated in the gate insulating layer in the GaN-HEMT 108 and the resistance between the gate and source of the GaN-HEMT 108 is gradually reduced. As a result, when the GaN-HEMT 108 is turned on, a leak current flows into the gate resistor 109. Incidentally, ringing is also superimposed on the leak current as well.

When a leak current flows into the gate resistor 109, the potential V2 is generated at one end of the gate resistor 109 and the potential V1 is generated at the other end of the gate resistor 109. The potentials V1 and V2 are respectively input to the first input terminal IN+ and second input terminal IN− of the potential difference detecting circuit 111. Then, the detection voltage VDET amplified according to the above voltage amplification degree is output from the output terminal OUT of the potential difference detecting circuit 111.

Subsequently, a damage prediction operation is performed according to the results of program execution by the microcomputer 112.

First, to acquire the reference voltage VREF corresponding to a period during which ringing is not superimposed on the gate voltage, the ADC 2 samples the detection voltage VDET at, for example, a timing at which the midpoint of a high-level period of the switching signal is reached, after which the ADC 2 acquires the sampled detection voltage VDET and converts it to digital data DC. Incidentally, when a timing for sampling by the ADC 2 is set to a timing at which the midpoint of a high-level period of the switching signal is reached, it suffices to, for example, create a signal with a duty cycle of 50% that takes a high-level period of a PWM signal synchronous with the switching signal as one cycle and use a timing at which the signal changes (S101).

Next, the comparing unit 162 compares the digital data DC indicating the detection voltage VDET and the digital data DCR indicating the reference voltage VREF (S102). If the value of the digital data DC is smaller than the value of the digital data DCR (S102: NO), the comparing unit 162 outputs a low-level comparison signal, for example. Then, S101 above is executed again, and the ADC 2 outputs next digital data DC. On the other hand, if the value of the digital data DC exceeds the value of the digital data DCR (S102: YES), the comparing unit 162 outputs a high-level comparison signal, for example.

Next, when the high-level comparison signal is input, the predicting unit 163 predicts that predetermined damage has been accumulated in the gate insulating layer in the GaN-HEMT 108. When a result (for example, the value of a flag) of the prediction that predetermined damage has been accumulated in the gate insulating layer in the GaN-HEMT 108 is input, the output unit 164 outputs a high-level output signal, for example. When the high-level output signal is input, the control unit 161 stops the output of the PWM signal to stop the switching operation of the GaN-HEMT 108 (S103).

By executing S101 to S103 above, it becomes possible to prevent the AC-DC converter 100 from being troubled due to the destruction of the GaN-HEMT 108.

Figure 7:
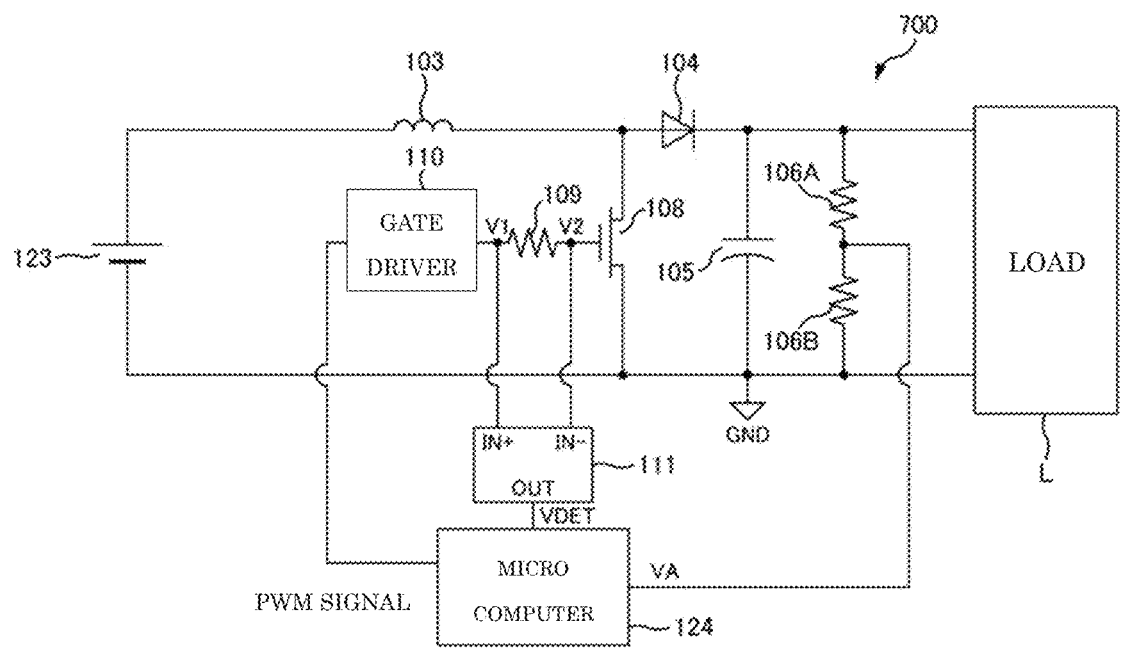
FIG. 7 is a circuit block diagram indicating an example of a step-up DC-DC converter including a damage predicting device according to a second example embodiment of the present disclosure.
Figure 8:
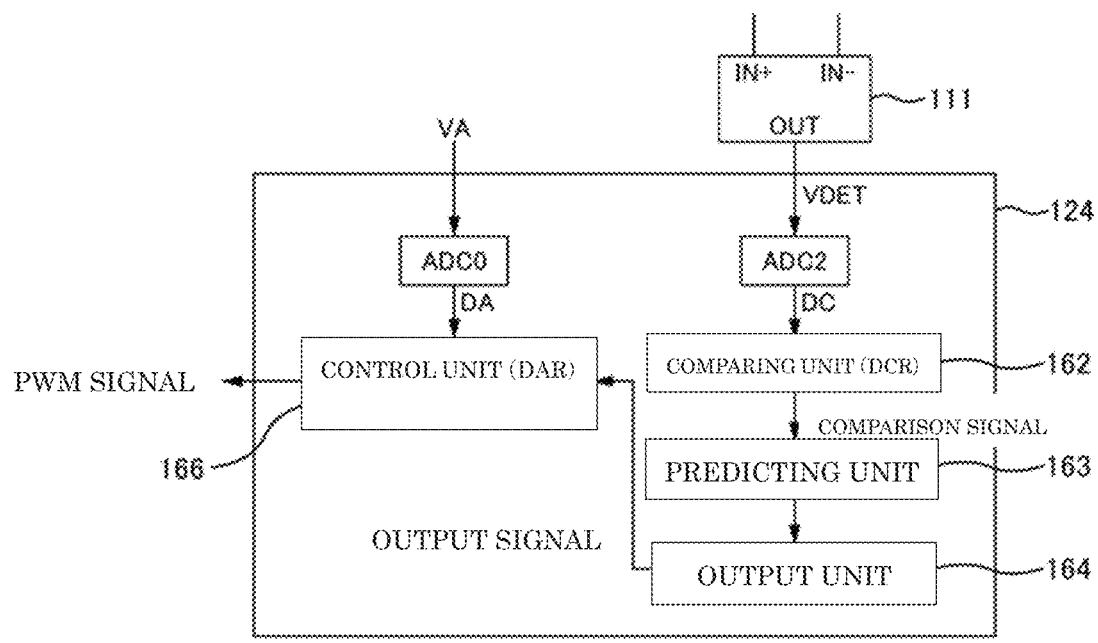
FIG. 8 is a block diagram indicating an example of functions of a microcomputer used in the damage predicting device according to the second example embodiment of the present disclosure.

FIG. 7 is a circuit block diagram indicating an example of a step-up DC-DC converter having a damage predicting device according to this example embodiment. FIG. 8 is a block diagram indicating an example of functions of a microcomputer used in the damage predicting device according to this example embodiment.

The structure of the DC-DC converter having the damage predicting device according to this example embodiment will be descried below while FIG. 7 and FIG. 8 are being referenced. Incidentally, the same structures as in the AC-DC converter 100 will be assigned the same numbers and the descriptions of these structures will be omitted.

The DC-DC converter 700 indicated in FIG. 7 is an electric power conversion device that, when a direct-current voltage is converted to a direct-current voltage higher than the direct-current voltage, outputs a direct-current voltage with a predetermined value by turning on/off the GaN-HEMT 108 at a frequency similar to the frequency in the AC-DC converter 100.

The DC-DC converter 700 differs from the AC-DC converter 100 in that the DC-DC converter 700 has a direct-current power supply 123 instead of the alternating-current power supply 101 and full-wave rectifying circuit 102 and does not have the current detecting resistor 107 and current detecting circuit 122. Incidentally, the damage predicting device is structured by including the gate resistor 109, the gate driver 110, the potential difference detecting circuit 111, and a microcomputer 124.

The microcomputer 124 indicated in FIG. 8 differs from the microcomputer 112 in that the microcomputer 124 does not have the ADC 1. Furthermore, a control unit 166 differs from the control unit 161 in that the control unit 166 does not store the reference digital data DBR. That is, the control unit 166 only compares the digital data DA output from the ADC 0 and the reference digital data DAR and outputs a PWM signal in which its On period and Off periods have been adjusted so that the detection voltage VA generated at the contact point between the voltage detecting resistors 106A and 106B approaches a fixed value.

An operation from when a direct current generated from the direct-current power supply 123 is supplied to the choke coil 103 until the microcomputer 124 outputs a PWM signal is similar to the operation of the AC-DC converter 100 except that the control unit 166 does not consider the reference digital data DBR.

Figure 9:
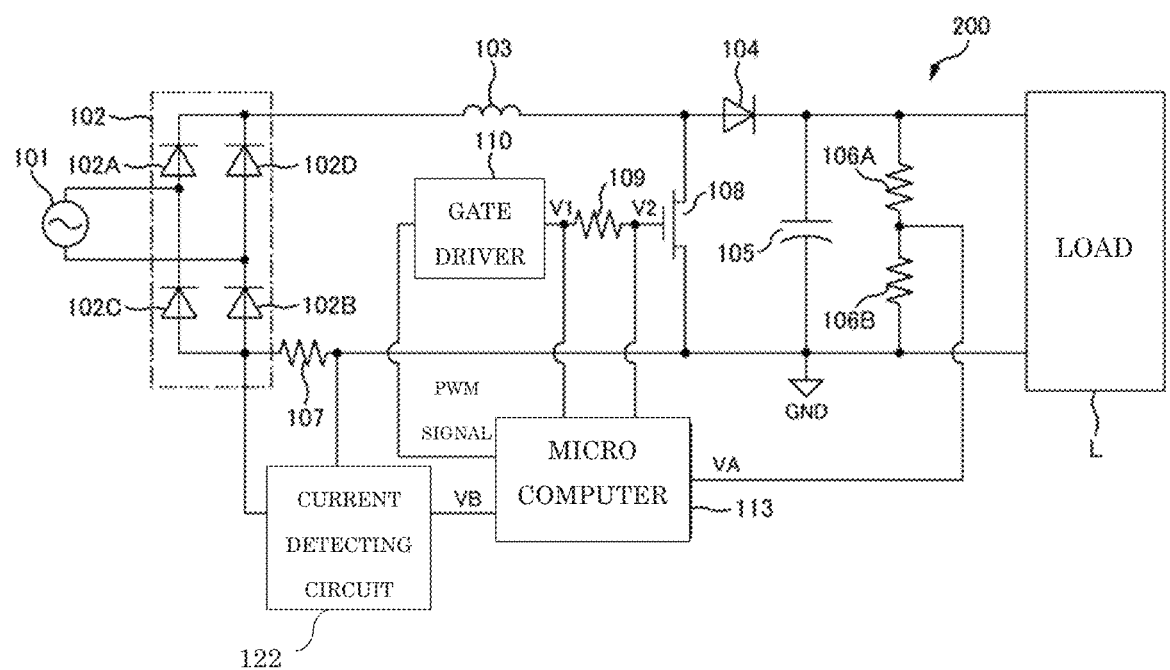
FIG. 9 is a circuit block diagram indicating an example of a step-up AC-DC converter including a damage predicting device according to a third example embodiment of the present disclosure.
Figure 10:
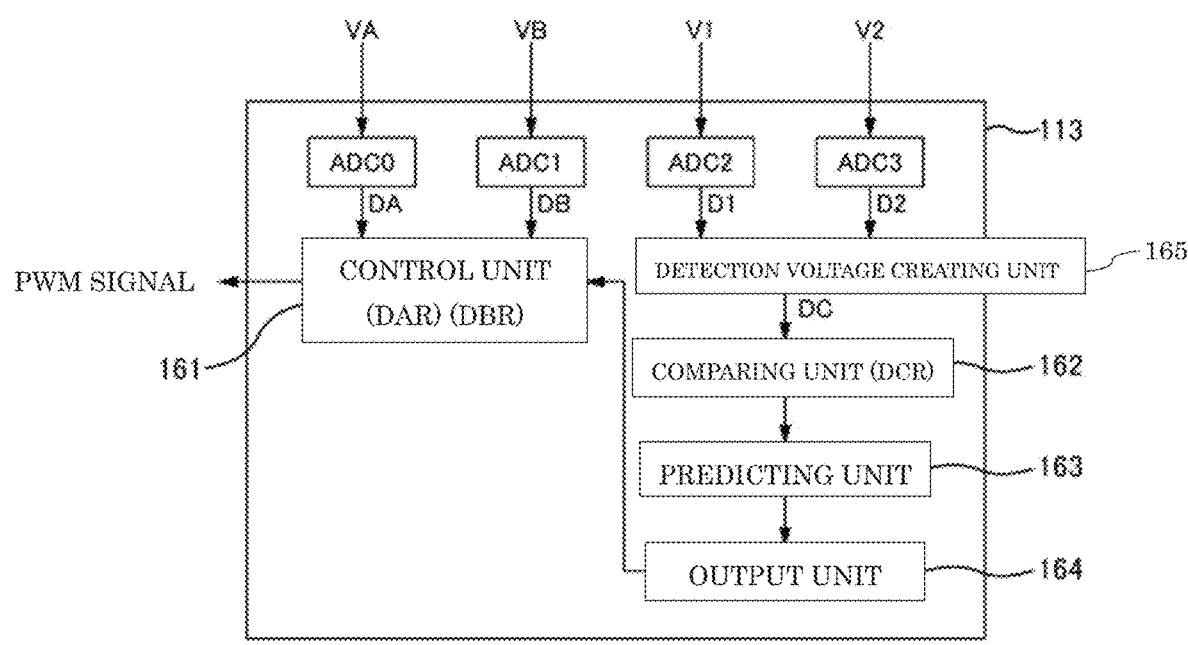
FIG. 10 is a block diagram indicating an example of functions implemented by a microcomputer used in the damage predicting device according to the third example embodiment of the present disclosure.

FIG. 9 is a circuit block diagram indicating an example of a step-up AC-DC converter having a damage predicting device according to this example embodiment. FIG. 10 is a block diagram indicating an example of functions implemented by a microcomputer used in the damage predicting device according to this example embodiment.

The structure of the AC-DC converter having the damage predicting device according to this example embodiment will be descried below while FIG. 9 and FIG. 10 are being referenced. Incidentally, the same structures as in the AC-DC converter 100 will be assigned the same numbers and the descriptions of these structures will be omitted.

The AC-DC converter 200 indicated in FIG. 9 differs from the AC-DC converter 100 in that the AC-DC converter 200 does not have the potential difference detecting circuit 111 and, by software processing by the microcomputer 113, digital data DC equivalent to the detection voltage VREF is created from the potentials V1 and V2 generated at both ends of the gate resistor 109. Incidentally, the damage predicting device is structured by including the gate resistor 109, gate driver 110, and microcomputer 113. Incidentally, when the AC-DC converter 200 is used as a DC-DC converter, it suffices for the direct-current power supply 123 to be provided instead of the alternating-current power supply 101 and full-wave rectifying circuit 102.

The microcomputer 113 indicated in FIG. 10 differs from the microcomputer 112 in that newly, the microcomputer 113 has an ADC 3 as the AD converter group 155 and also has a detection voltage creating unit 165. Incidentally, the detection voltage creating unit 165 is a function implemented when the CPU 152 reads out a program from the ROM 151 and executes the program. Incidentally, when the AC-DC converter 200 is used as a DC-DC converter, the ADC 1, to which the detection voltage VB is input, and the reference digital data DBR stored in the control unit 166 become unnecessary.

The ADC 2 acquires the potential V1 generated at the other end of the gate resistor 109 and converts the potential V1 to digital data D1. To eliminate the effect of ringing, the ADC 2 samples the potential V1 at, for example, a timing at which the midpoint of a high-level period of the switching signal is reached, after which the ADC 2 acquires the sampled potential V1 and converts it to digital data D1. On the other hand, the ADC 3 acquires the potential V2 generated at one end of the gate resistor 109 and converts the potential V2 to digital data D2. To eliminate the effect of ringing, the ADC 3 samples the potential V2 at the same timing as the timing of sampling by the ADC 2, after which the ADC 3 acquires the sampled potential V2 and converts it to digital data D2.

The detection voltage creating unit 165 creates digital data DC equivalent to the detection voltage VREF by performing subtraction processing on the digital data D1 and D2, and outputs the digital data DC to the comparing unit 162. Incidentally, processing until the output of the PWM signal is stopped according to the result of comparison by the comparing unit 162 is similar to processing by the microcomputer 112.

In the case of this example embodiment, bit resolution equivalent to the voltage amplification degree of the potential difference detecting circuit 111 is required for the ADC 2 and ADC 3, but the potential difference detecting circuit 111 becomes unnecessary, so it becomes possible to reduce the circuit scale of the damage predicting device.

Figure 11:
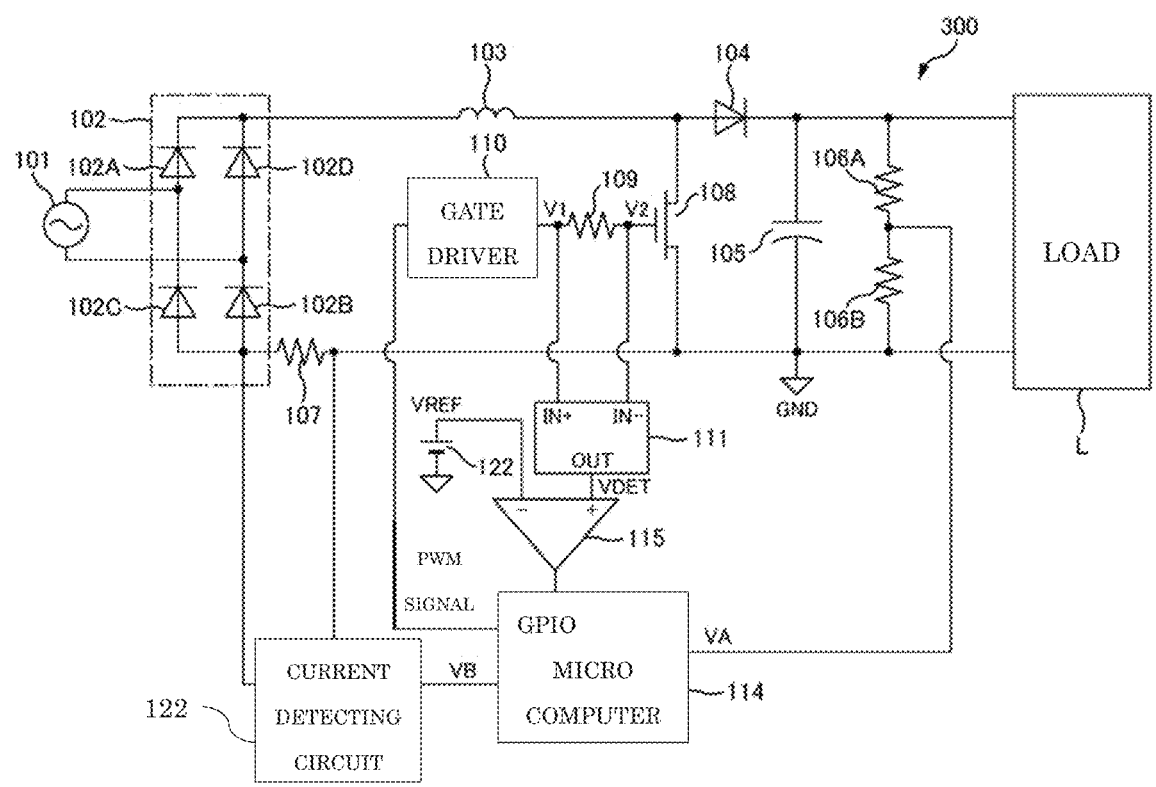
FIG. 11 is a circuit block diagram indicating an example of a step-up AC-DC converter including a damage predicting device according to a fourth example embodiment of the present disclosure.
Figure 12:
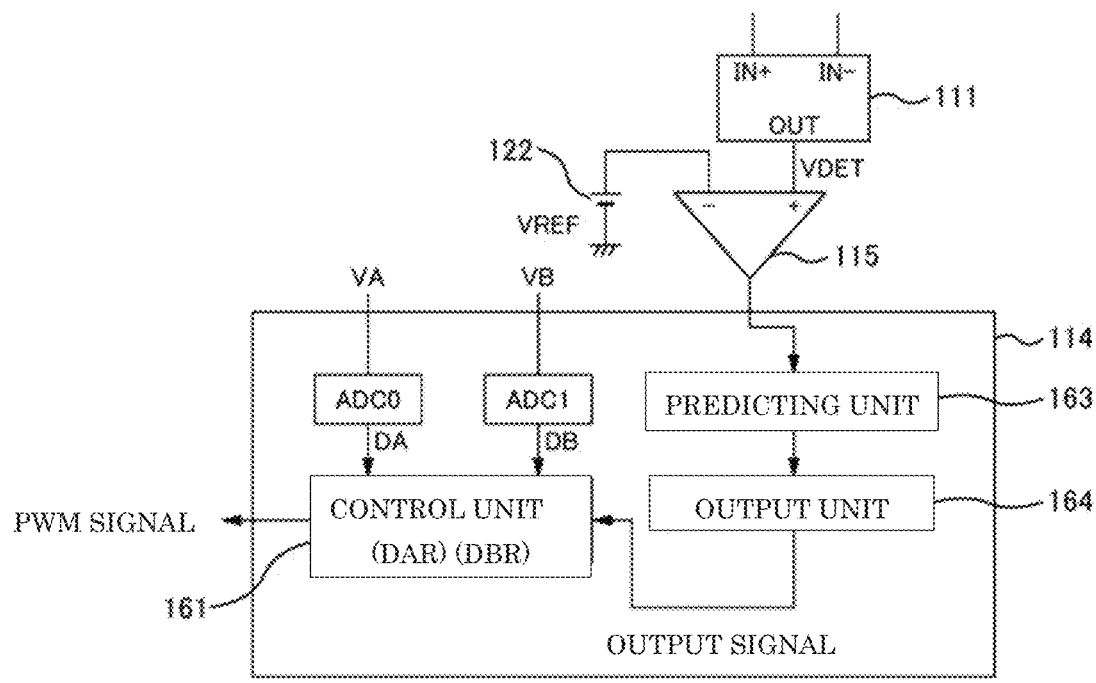
FIG. 12 is a block diagram indicating an example of functions implemented by a microcomputer used in the damage predicting device according to the fourth example embodiment of the present disclosure.

FIG. 11 is a circuit block diagram indicating an example of a step-up AC-DC converter having a damage predicting device according to this example embodiment. FIG. 12 is a block diagram indicating an example of functions implemented by a microcomputer used in the damage predicting device according to this example embodiment.

The structure of the AC-DC converter having the damage predicting device according to this example embodiment will be descried below while FIG. 11 and FIG. 12 are being referenced. Incidentally, the same structures as in the AC-DC converter 100 will be assigned the same numbers and the descriptions of these structures will be omitted.

The AC-DC converter 300 indicated in FIG. 11 differs from the AC-DC converter 100 in that the AC-DC converter 300 has a comparator 115 between the output terminal OUT of the potential difference detecting circuit 111 and a GPIO (General Purpose Input/Output), which functions as a general-purpose I/O port, the GPIO being part of the I/O port group 154 in a microcomputer 114. Incidentally, the damage predicting device is structured by including the gate resistor 109, gate driver 110, potential difference detecting circuit 111, microcomputer 114, and comparator 115. Incidentally, when the AC-DC converter 300 is used as a DC-DC converter, it suffices for the direct-current power supply 123 to be provided instead of the alternating-current power supply 101 and full-wave rectifying circuit 102.

The microcomputer 114 indicated in FIG. 12 differs from the microcomputer 112 in that the microcomputer 114 does not have the ADC 2 and comparing unit 162. Incidentally, when the AC-DC converter 300 is used as a DC-DC converter, the ADC 1, to which the detection voltage VB is input, and the reference digital data DBR stored in the control unit 166 become unnecessary.

The detection voltage VDET output from the output terminal OUT of the potential difference detecting circuit 111 is applied to the first input terminal (+) of the comparator 115. On the other hand, the reference voltage VREF generated from the direct-current power supply 116 is applied to the second input terminal (−) of the comparator 115. Incidentally, the reference voltage VREF is the same voltage as the detection voltage VDET when predetermined damage has been accumulated in the gate insulating layer in the GaN-HEMT 108. If the detection voltage VDET exceeds the reference voltage VREF, the comparator 115 outputs a high-level comparison signal indicating that predetermined damage has been accumulated in the gate insulating layer in the GaN-HEMT 108. The comparison signal is input to the predicting unit 163 through the GPIO. Incidentally, processing until the output of the PWM signal is stopped according to the result of comparison by the predicting unit 163 is similar to processing by the microcomputer 112.

In the case of this example embodiment, AD conversion processing is not performed in processing in which the detection voltage VDET and reference voltage VREF are compared, so the number of channels in the AD converter group 155 can be saved.

Figure 13:
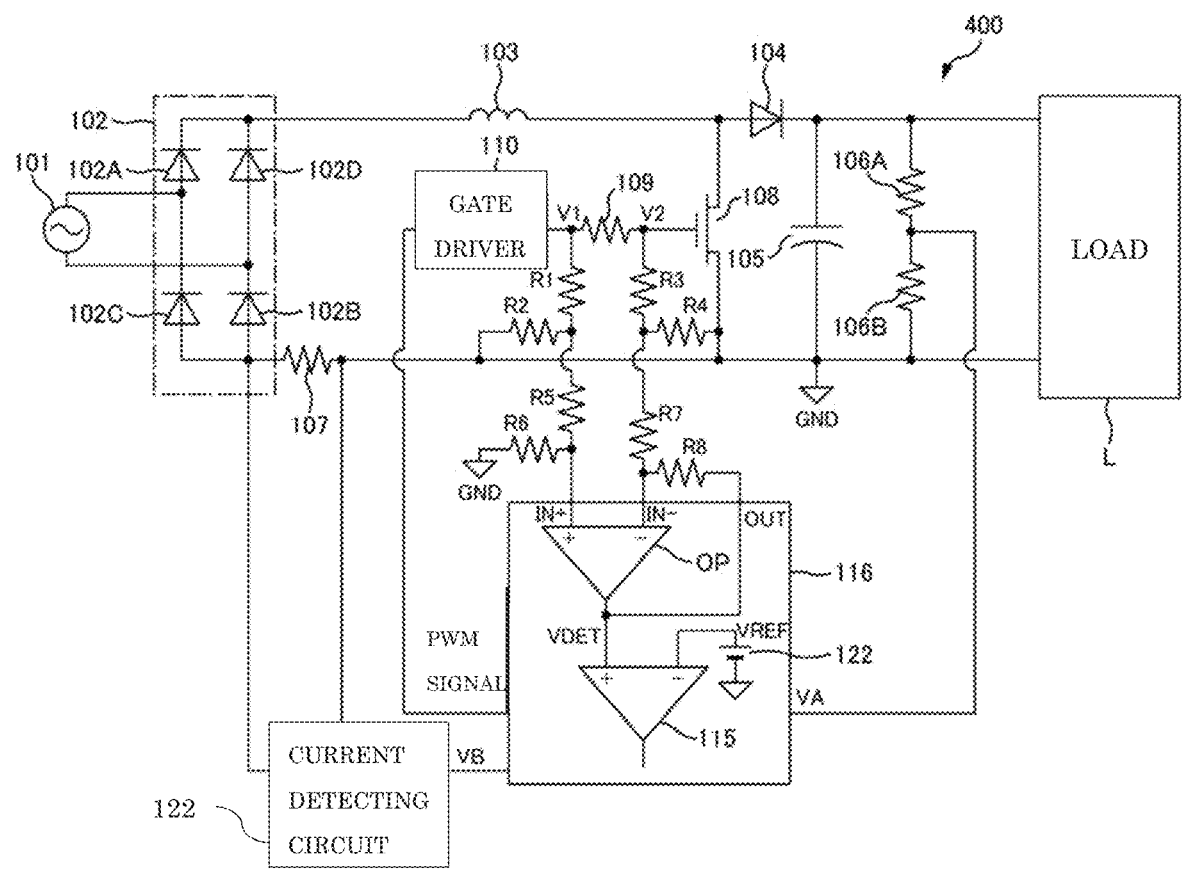
FIG. 13 is a circuit block diagram indicating an example of a step-up AC-DC converter including a damage predicting device according to a fifth example embodiment of the present disclosure.
Figure 14:
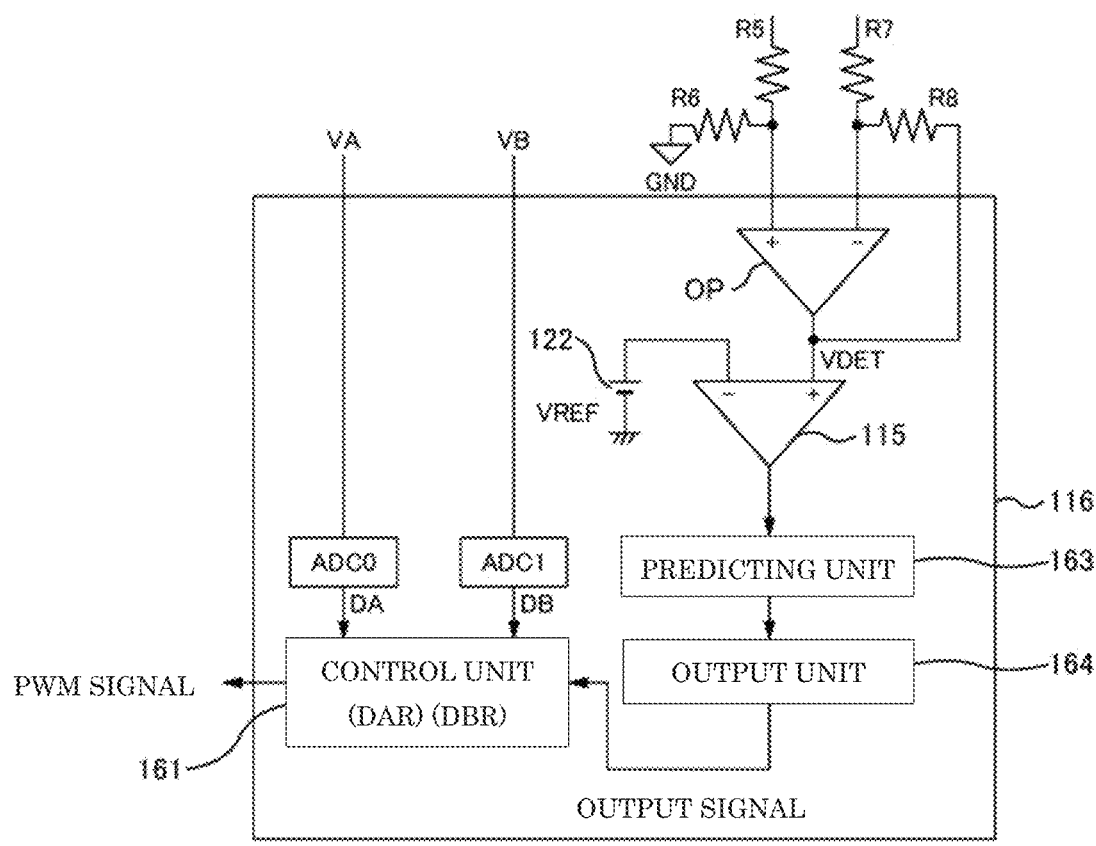
FIG. 14 is a block diagram indicating an example of functions of a microcomputer used in the damage predicting device according to the fifth example embodiment of the present disclosure.

FIG. 13 is a circuit block diagram indicating an example of a step-up AC-DC converter having a damage predicting device according to this example embodiment. FIG. 14 is a block diagram indicating an example of functions of a microcomputer used in the damage predicting device according to this example embodiment.

The structure of the AC-DC converter having the damage predicting device according to this example embodiment will be descried below while FIG. 13 and FIG. 14 are being referenced. Incidentally, the same structures as in the AC-DC converter 300 will be assigned the same numbers and the descriptions of these structures will be omitted.

The AC-DC converter 400 indicated in FIG. 13 differs from the AC-DC converter 300 in that the operational amplifier OP constituting the potential difference detecting circuit 111 and the comparator 115 are incorporated into the microcomputer 116. Incidentally, the damage predicting device is structured by including the gate resistor 109, the gate driver 110, the dividing resistors R1 to R4, the input resistors R5 and R7, the feedback resistance R8, ground resistor R6, and a microcomputer 116. Incidentally, when the AC-DC converter 400 is used as a DC-DC converter, it suffices for the direct-current power supply 123 to be provided instead of the alternating-current power supply 101 and full-wave rectifying circuit 102, and the ADC 1, to which the detection voltage VB is input, and the reference digital data DBR stored in the control unit 166 become unnecessary in the microcomputer 116 indicated in FIG. 14.

The dividing resistors R1 and R2 are connected in series between one end of the gate resistor 109 and the ground GND. The connection point between the dividing resistors R1 and R2 is connected to the first input terminal (+) of the operational amplifier OP through the input resistor R5. The dividing resistors R3 and R4 are connected in series between the other end of the gate resistor 109 and the ground GND. The connection point between the dividing resistors R3 and R4 is connected to the second input terminal (−) of the operational amplifier OP through the input resistor R7. The feedback resistance R8 is connected between the second input terminal (−) of the operational amplifier OP and its output terminal. The ground resistor R6 is connected between the first input terminal (+) of the operational amplifier OP and the ground GND.

In the case of this example embodiment, the operational amplifier OP constituting the potential difference detecting circuit 111 and the comparator 115 are implemented by an operational amplifier and a comparator that are incorporated into the microcomputer 116, so the number of external IC parts can be reduced.

Figure 15:
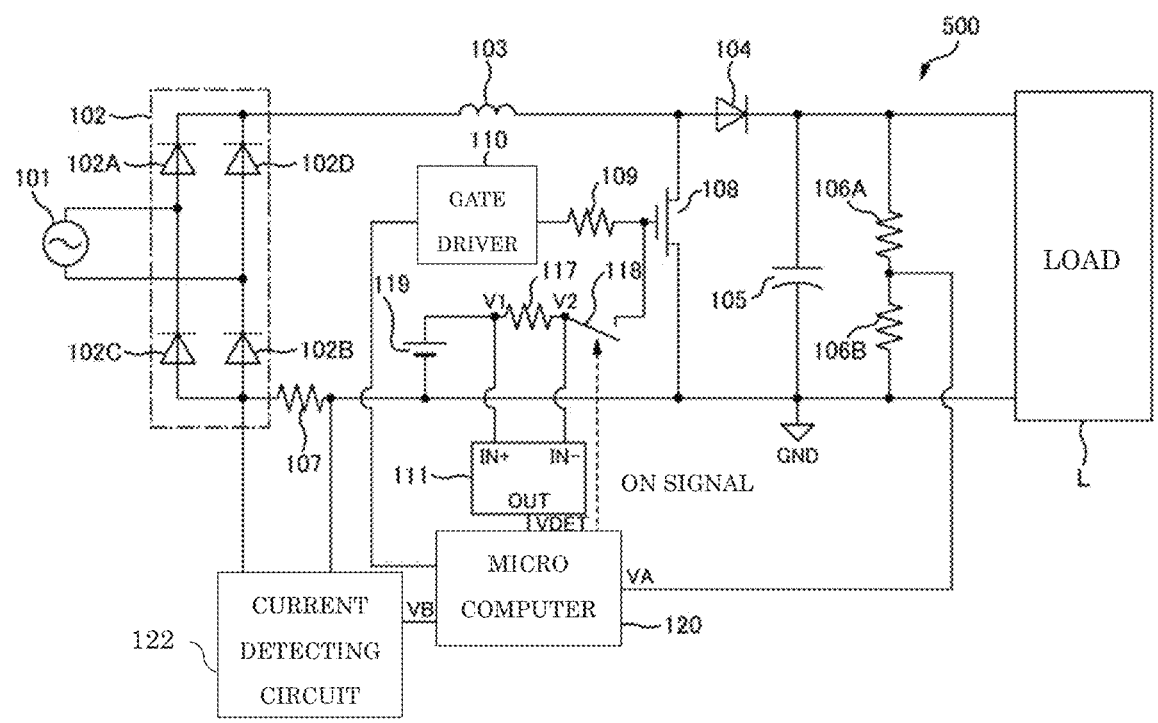
FIG. 15 is a circuit block diagram indicating an example of a step-up AC-DC converter including a damage predicting device according to a sixth example embodiment of the present disclosure.
Figure 16:
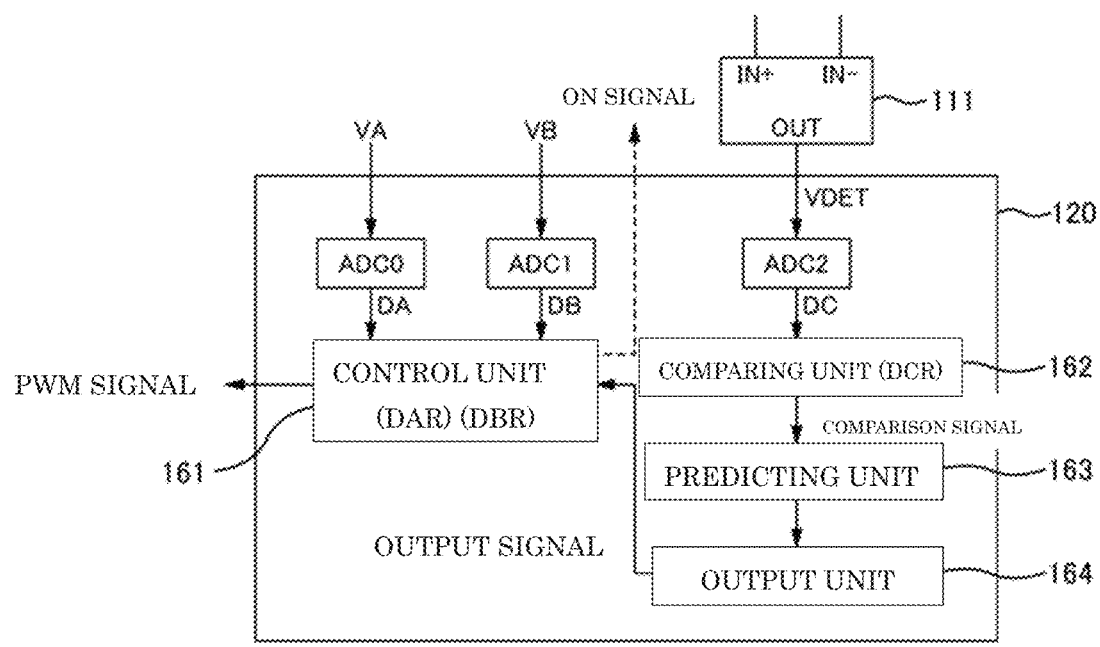
FIG. 16 is a block diagram indicating an example of functions of a microcomputer used in the damage predicting device according to the sixth example embodiment of the present disclosure.

FIG. 15 is a circuit block diagram indicating an example of a step-up AC-DC converter having a damage predicting device according to this example embodiment. FIG. 16 is a block diagram indicating an example of functions of a microcomputer used in the damage predicting device according to this example embodiment.

The structure of the AC-DC converter having the damage predicting device according to this example embodiment will be descried below while FIG. 15 and FIG. 16 are being referenced. Incidentally, the same structures as in the AC-DC converter 100 will be assigned the same numbers and the descriptions of these structures will be omitted.

The AC-DC converter 500 indicated in FIG. 15 differs from the AC-DC converter 100 in that the AC-DC converter 500 has a gate resistor 117 (resistor), a switch 118, and a direct-current power supply 119 that are specific to the obtaining of the detection voltage VDET. Incidentally, the damage predicting device is structured by including the gate resistor 117, the switch 118, the direct-current power supply 119, the potential difference detecting circuit 111, and a microcomputer 120. Incidentally, when the AC-DC converter 500 is used as a DC-DC converter, it suffices to provide the direct-current power supply 123 instead of the alternating-current power supply 101 and full-wave rectifying circuit 102.

The microcomputer 120 indicated in FIG. 16 differs from the microcomputer 112 in that an On signal used to turn on the switch 118 for a certain period is output from the control unit 161. Incidentally, when the AC-DC converter 500 is used as a DC-DC converter, the ADC 1, to which the detection voltage VB is input, and the reference digital data DBR stored in the control unit 166 become unnecessary.

The switch 118 is connected between the gate of the GaN-HEMT 108 and one end of the gate resistor 117. The direct-current power supply 119 is connected between the other end of the gate resistor 117 and the ground GND. While the AC-DC converter 500 is placed on standby before starting an operation to covert an alternating-current voltage to a direct-current voltage, the switch 118 is turned on for a certain period by an On signal output from the control unit 161 in the microcomputer 120.

First, when an On signal is output from the control unit 161 for a certain period while the AC-DC converter 500 is placed on standby, the switch 118 is turned on for a certain period in response to the On signal. Here, if damage has been accumulated in the gate insulating layer in the GaN-HEMT 108, the resistance value between the gate and source of the GaN-HEMT 108 has been reduced. Therefore, a leak current flows into the gate resistor 117. Then, the potentials V1 and V2 generated at both ends of the gate resistor 117 are respectively input to the first input terminal IN+ and second input terminal IN− of the potential difference detecting circuit 111. Incidentally, processing until the output of the PWM signal is stopped according to the detection voltage VDET output from the potential difference detecting circuit 111 is similar to processing by the microcomputer 112.

The gate resistor 109 has a role to play in suppressing ringing noise superimposed on the gate voltage. Therefore, if the gate resistor 109 doubles as a resistor used to obtain the detection voltage VDET as indicated in the first to fifth example embodiments, restrictions are imposed when the resistance value of the gate resistor 109 is set.

In contrast to this, the gate resistor 117 is a resistor used to obtain the detection voltage VDET. Although the processing capacity of the microcomputer 120 needs to be considered for the resistance value of the gate resistor 117, it becomes possible to set the resistance value to a value by which an optimum detection voltage VDET can be obtained.

At this time, it becomes also possible to use a ferrite bead, which is a special part that suppresses noise, instead of the gate resistor 109.

The switch 118 is a transistor element such as a MOSFET. The level of the direct-current voltage generated from the direct-current power supply 119 is the same as the high level of the switching signal output from the gate driver 110.

Figure 17:
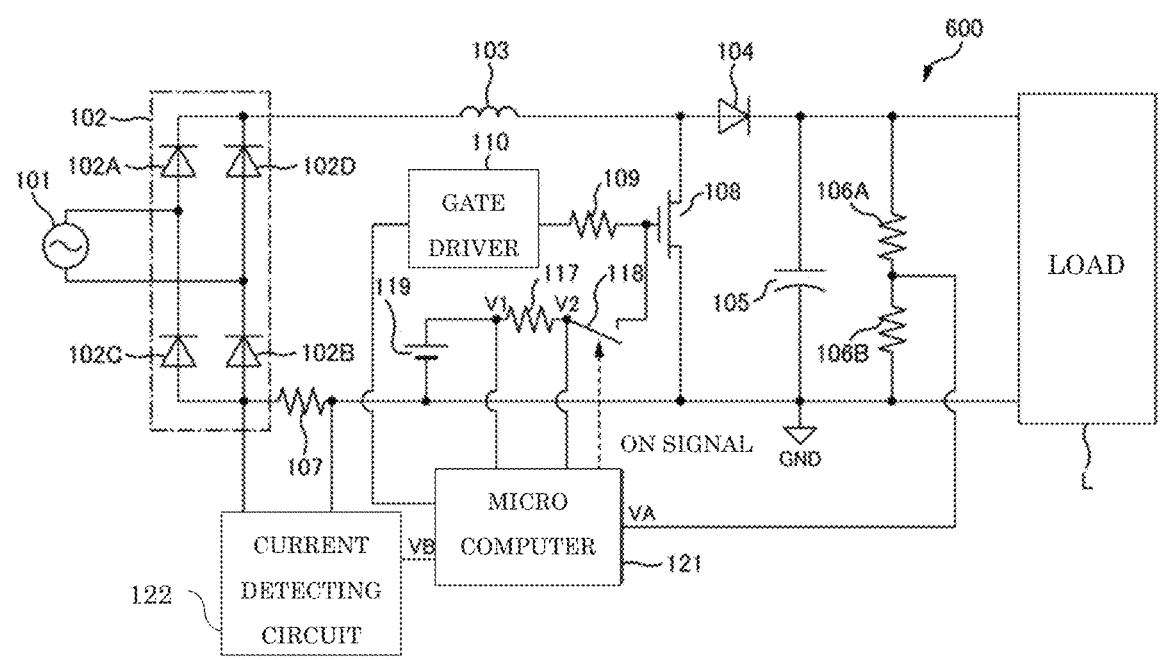
FIG. 17 is a circuit block diagram indicating an example of a step-up AC-DC converter including a damage predicting device according to a seventh example embodiment of the present disclosure.
Figure 18:
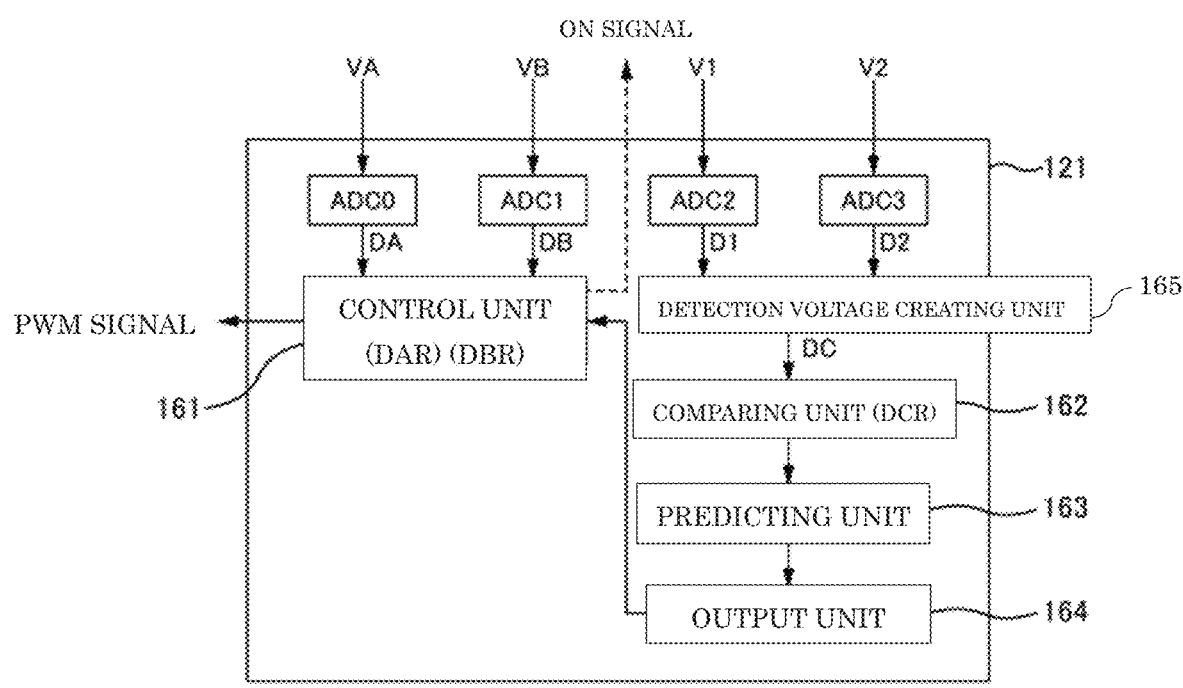
FIG. 18 is a block diagram indicating an example of functions of a microcomputer used in the damage predicting device according to the seventh example embodiment of the present disclosure.

FIG. 17 is a circuit block diagram indicating an example of a step-up AC-DC converter having a damage predicting device according to this example embodiment. FIG. 18 is a block diagram indicating an example of functions of a microcomputer used in the damage predicting device according to this example embodiment.

The structure of the AC-DC converter having the damage predicting device according to this example embodiment will be descried below while FIG. 17 and FIG. 18 are being referenced. Incidentally, the same structures as in the AC-DC converters 200 and 500 will be assigned the same numbers and the descriptions of these structures will be omitted.

The AC-DC converter 600 indicated in FIG. 17 differs from the AC-DC converter 500 in that the AC-DC converter 600 does not have the potential difference detecting circuit 111 and, by software processing by the microcomputer 121, digital data DC equivalent to the detection voltage VREF is created from the potentials V1 and V2 generated at both ends of the gate resistor 117. Incidentally, the damage predicting device is structured by including the gate resistor 117, switch 118, direct-current power supply 119, and microcomputer 121. Incidentally, when the AC-DC converter 600 is used as a DC-DC converter, it suffices to provide the direct-current power supply 123 instead of the alternating-current power supply 101 and full-wave rectifying circuit 102.

The microcomputer 121 indicated in FIG. 18 differs from the microcomputer 113 in that an On signal used to turn on the switch 118 for a certain period is output from the control unit 161. Incidentally, when the AC-DC converter 600 is used as a DC-DC converter, the ADC 1, to which the detection voltage VB is input, and the reference digital data DBR stored in the control unit 166 become unnecessary.

While the AC-DC converter 600 is placed on standby before starting an operation to covert an alternating-current voltage to a direct-current voltage, the switch 118 is turned on for a certain period by the On signal output from the control unit 161 in the microcomputer 121.

First, when an On signal is output from the control unit 161 for a certain period while the AC-DC converter 600 is placed on standby, the switch 118 is turned on for a certain period in response to the On signal. Here, if damage has been accumulated in the gate insulating layer in the GaN-HEMT 108, the resistance value between the gate and source of the GaN-HEMT 108 has been reduced. Therefore, a leak current flows into the gate resistor 117. Then, the potentials V1 and V2 generated at both ends of the gate resistor 117 are respectively input to the ADC 2 and ADC 3. Incidentally, processing until the output of the PWM signal is stopped according to the digital data D1 and D2, which are respectively output from the ADC 2 and ADC 3 is similar to processing by the microcomputer 113.

In the case of this example embodiment, bit resolution equivalent to the voltage amplification degree of the potential difference detecting circuit 111 is required for the ADC 2 and ADC 3, but the potential difference detecting circuit 111 becomes unnecessary, so it becomes possible to reduce the circuit scale of the damage predicting device.

As described above, according to the damage predicting device, it becomes possible to predict the destruction of the GaN-HEMT 108 and to prevent the AC-DC converters 100 to 600 and the DC-DC converters 700 to 1200 from being troubled.

In the damage predicting device, it is also possible to use a FET, a MOSFET, or an IGBT formed from SiC (silicon carbide) may be used as a power semiconductor switching element, instead of the GaN-HEMT 108.

Incidentally, the above example embodiments are intended for easy understanding of the present disclosure and are not intended to interpret the present disclosure under limitations. The present disclosure can be changed or modified without departing from the intended scope of the present disclosure, and equivalents of the present disclosure are also included in the present disclosure. For example, the damage predicting devices described in the first to seventh example embodiments are not limited to a step-up AC-DC converter and DC-DC converter, but can also be used to predict damage in a gate insulating layer in a power semiconductor switching element in a step-down AC-DC converter and DC-DC converter and in an inverter.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A damage predicting device of a power semiconductor switching element, the damage predicting device comprising:
    a resistor connected to a gate of the power semiconductor switching element; and
    control circuitry; wherein
    the control circuitry:
        compares, when a predetermined voltage is applied to the gate of the power semiconductor switching element, a detection voltage matching a voltage generated between two ends of the resistor and a reference voltage; and
        predicts, when the detection voltage exceeds the reference voltage, that predetermined damage has been accumulated in a gate insulating layer in the power semiconductor switching element; and
    the control circuitry is incorporated into a microcomputer and compares outputs resulting from Analog-to-Digital conversion of the detection voltage and the reference voltage.

2. The damage predicting device according to claim 1, wherein the control circuitry outputs a signal indicating that predetermined damage has been accumulated in the gate insulating layer in the power semiconductor switching element, according to a result of the prediction performed by the control circuitry.

3. The damage predicting device according to claim 1, wherein the control circuitry further comprises potential difference detecting circuitry to which a first potential and a second potential that are generated at the two ends of the resistor, one potential at each of the two ends, are input, the potential difference detecting circuitry outputting the detection voltage according to the first potential and the second potential.

4. The damage predicting device according to claim 3, wherein the potential difference detecting circuitry includes a differential amplification circuit in which the first potential is input to a first input terminal, the second potential is input to a second input terminal, and the detection voltage is amplified to a predetermined voltage and is output from an output terminal.

5. The damage predicting device according to claim 1, wherein:
    a switching signal is input to one end of the resistor, a second end being opposite to the one end of the resistor and the second end being connected to a gate side of the power semiconductor switching element;
    the switching signal becomes a first voltage when the power semiconductor switching element is turned on and becomes a second voltage that is lower than the first voltage when the power semiconductor switching element is turned off; and
    the predetermined voltage is a voltage that is applied to the gate of the power semiconductor switching element when the switching signal is the first voltage.

6. The damage predicting device according to claim 1, wherein the power semiconductor switching element is any one of a Field Effect Transistor made of gallium nitride, a Field Effect Transistor made of silicon carbide, and an Insulated Gate Bipolar Transistor.

7. A damage predicting device of a power semiconductor switching element, the damage predicting device comprising:
    a resistor connected to a gate of the power semiconductor switching element; and
    control circuitry; wherein
    the control circuitry:
        compares, when a predetermined voltage is applied to the gate of the power semiconductor switching element, a detection voltage matching a voltage generated between two ends of the resistor and a reference voltage; and
        predicts, when the detection voltage exceeds the reference voltage, that predetermined damage has been accumulated in a gate insulating layer in the power semiconductor switching element:
    while the power semiconductor switching element is placed on standby, during which the power semiconductor switching element is not operating, one end of the resistor on a same side as the gate of the power semiconductor switching element is connected to the gate of the power semiconductor switching element through a switch and a direct-current power supply is connected to a second end of the resistor, the second end being opposite to the one end on the same side as the gate of the power semiconductor switching element; and
    the predetermined voltage is a voltage that is applied to the gate of the power semiconductor switching element when the switch is closed.

8. A damage predicting method of a power semiconductor switching element which uses a damage Predicting device including:
    a resistor connected to a gate of the power semiconductor switching element; and
    control circuitry; wherein
    the control circuitry:
    compares, when a predetermined voltage is applied to the gate of the power semiconductor switching element, a detection voltage matching a voltage generated between two ends of the resistor and a reference voltage; and predicts, when the detection voltage exceeds the reference voltage, that predetermined damage has been accumulated in a gate insulating layer in the power semiconductor switching element;

while the power semiconductor switching element is placed on standby, during which the power semiconductor switching element is not operating, one end of the resistor on a same side as the gate of the power semiconductor switching element is connected to the gate of the power semiconductor switching element through a switch and a direct-current power supply is connected to a second end of the resistor, the second end being opposite to the one end on the same side as the gate of the power semiconductor switching element; and the predetermined voltage is a voltage that is applied to the gate of the power semiconductor switching element when the switch is closed;

the damage predicting method comprising:

comparing a voltage generated between two ends of a resistor connected to a gate of the power semiconductor switching element and a reference voltage when a predetermined voltage is applied to the gate of the power semiconductor switching element; and predicting that predetermined damage has been accumulated in a gate insulating layer in the power semiconductor switching element when the detection voltage exceeds the reference voltage.

9. An AC-DC converter, comprising:

a full-wave rectifying circuit connected to an alternating-current power supply;

a choke coil, one end of which is connected to an output end of the full-wave rectifying circuit;

a power semiconductor switching element connected between another end of the choke coil and a ground;

a diode and a smoothing capacitor that are connected in series between the another end of the choke coil and the ground;

a controller that turns on/off the power semiconductor switching element according to a voltage generated between both ends of the smoothing capacitor;

a resistor connected to a gate of the power semiconductor switching element;

comparison circuitry that, when a predetermined voltage is applied to the gate of the power semiconductor switching element, compares a detection voltage matching a voltage generated between two ends of the resistor and a reference voltage; and prediction circuitry that, when the detection voltage exceeds the reference voltage, predicts that predetermined damage has been accumulated in a gate insulating layer in the power semiconductor switching element; wherein the prediction circuitry:

compares, when a predetermined voltage is applied to the gate of the power semiconductor switching element, a detection voltage matching a voltage generated between two ends of the resistor and a reference voltage; and predicts, when the detection voltage exceeds the reference voltage, that predetermined damage has been accumulated in a gate insulating layer in the power semiconductor switching element;

while the power semiconductor switching element is placed on standby, during which the power semiconductor switching element is not operating, one end of the resistor on a same side as the gate of the power semiconductor switching element is connected to the gate of the power semiconductor switching element through a switch and a direct-current power supply is connected to a second end of the resistor, the second end being opposite to the one end on the same side as the gate of the power semiconductor switching element; and the predetermined voltage is a voltage that is applied to the gate of the power semiconductor switching element when the switch is closed.

10. A DC-DC converter, comprising:

a choke coil, one end of which is connected to a direct-current power supply;

a power semiconductor switching element connected between another end of the choke coil and a ground;

a diode and a smoothing capacitor that are connected in series between the another end of the choke coil and the ground;

control circuitry that turns on/off the power semiconductor switching element according to a voltage generated between two ends of the smoothing capacitor;

a resistor connected to a gate of the power semiconductor switching element;

comparing circuitry that, when a predetermined voltage is applied to the gate of the power semiconductor switching element, compares a detection voltage matching a voltage generated between two ends of the resistor and a reference voltage; and predicting circuitry that, when the detection voltage exceeds the reference voltage, predicts that predetermined damage has been accumulated in a gate insulating layer in the power semiconductor switching element; wherein the prediction circuitry:

compares, when a predetermined voltage is applied to the gate of the power semiconductor switching element, a detection voltage matching a voltage generated between two ends of the resistor and a reference voltage; and predicts, when the detection voltage exceeds the reference voltage, that predetermined damage has been accumulated in a gate insulating layer in the power semiconductor switching element;

while the power semiconductor switching element is placed on standby, during which the power semiconductor switching element is not operating, one end of the resistor on a same side as the gate of the power semiconductor switching element is connected to the gate of the power semiconductor switching element through a switch and a direct-current power supply is connected to a second end of the resistor, the second end being opposite to the one end on the same side as the gate of the power semiconductor switching element; and the predetermined voltage is a voltage that is applied to the gate of the power semiconductor switching element when the switch is closed.

* * * * *